(12) United States Patent
Tamaki et al.

(10) Patent No.: US 6,218,907 B1
(45) Date of Patent: Apr. 17, 2001

(54) FREQUENCY COMPARATOR AND PLL CIRCUIT USING THE SAME

(75) Inventors: Ryo Tamaki; Tatsuya Kubo, both of Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/293,841

(22) Filed: Apr. 19, 1999

(30) Foreign Application Priority Data

Apr. 24, 1998 (JP) .................................................. 10-114491

(51) Int. Cl.[7] ...................................................... H04L 7/00
(52) U.S. Cl. ............................ 331/25; 331/1 A; 375/360; 375/376; 360/41
(58) Field of Search ..................................... 375/376, 360; 331/1 A, 25, 1 R; 360/41; 327/10

(56) References Cited

U.S. PATENT DOCUMENTS

| 4,371,975 | 2/1983 | Dugan | 360/51 X |
| 5,276,712 | * | 1/1994 | Pearson | 375/360 |

FOREIGN PATENT DOCUMENTS 0 502 739 A2    9/1992    (EP) .

* cited by examiner

Primary Examiner—Arnold Kinkead
(74) Attorney, Agent, or Firm—Ronald P. Kananen; Rader, Fishman & Grauer

(57) ABSTRACT

A frequency comparator for comparing the frequency of a predetermined clock signal with the clock frequency of a non-return-to-zero (NRZ) signal having a detector circuit for detecting a data change of the NRZ signal in an interval of one time period of the clock signal, and a comparator circuit for generating a comparison result only when a data change is detected by the detector. The detector includes a data change circuit for detecting a data change of the NRZ signal and a change position detector for detecting a data change position of the NRZ signal in a time period of the clock signal CLK by taking in the logic of a clock signal and an auxiliary clock signal having the phase delayed 90 degrees from that of the clock signal when a data change of the NRZ signal is detected. The comparator circuit has a setting circuit for setting a reference point for detecting the time period subsequent to the clock signal to generate the comparison result based on the reference point set by the setting circuit.

6 Claims, 6 Drawing Sheets

FREQUENCY COMPARATOR AND PLL CIRCUIT USING THE SAME

BACKGROUND OF THE INVENTION

1. Field of the Invention

This invention relates to a frequency comparator and a PLL (phase locked loop) circuit using the frequency comparator, and more particularly relates to a PLL circuit which synchronizes with NRZ (non return to zero) signal and a frequency comparator which is suitably used for the PLL circuit.

2. Description of Related Art

A conventional PLL circuit which synchronizes with NRZ signal employs a structure which compares the oscillation clock of a voltage control oscillator (VCO) with the outside reference clock frequency which synchronizes with NRZ signal for comparing the frequency. An exemplary circuit of a PLL circuit is shown in FIG. 5.

In FIG. 5, the oscillation clock of a voltage control oscillator 101 is served as one input to a phase comparator (PD) 102 and is served also as one input to a frequency phase comparator (PFD) 104 after the oscillation clock is divided into 1/n (n denotes a natural number) by a frequency divider 103. The phase comparator receives NRZ signal as the other signal, compares the phase of the oscillation clock of the voltage control oscillator 101 with that of the NRZ signal, and generates an UP signal for advancing the phase or a DOWN signal for delaying the phase based on the resultant phase difference.

On the other hand, the frequency phase comparator 104 receives a reference clock which synchronizes with NRZ signal as the other input, compares the 1/n divided oscillation clock of the voltage control oscillator 101 with the frequency of the reference clock, and generates an UP signal for increasing the frequency or a DOWN signal for decreasing the frequency based on the phase difference.

The respective two outputs of the phase comparator 102 and the frequency phase comparator 104 enter to a selector 105. The selector 105 selects one of two comparison outputs of the phase comparator 102 and the frequency phase comparator 104 based on a switching signal given by an external circuit (not shown in the drawing). The comparison output selected by the selector is supplied to the voltage control oscillator 101 through a charge pump circuit 106 and a loop filter 107 as a control voltage.

In the PLL circuit having the structure described herein above, first the selector 105 is switched to the frequency phase comparator 104 side, the frequency that is 1/n clock of the oscillation clock of the voltage control oscillator 101 is drawn to the frequency near to the reference clock based on the comparison output of the frequency phase comparator 104. After drawing, by giving a switching signal from an external circuit to the selector 105, the selector 105 is switched to the phase comparator 102 side. The oscillation clock of the voltage control oscillator 101 is phase-synchronized with NRZ signal based on the comparison output of the phase comparator 102.

The conventional PLL circuit needs a circuit for generating a reference clock which synchronizes with NRZ signal, and also needs an external circuit which detects drawing of 1/n clock frequency of the VCO clock to the frequency near to the reference clock and generates a switching signal to switch the selector 105, and such structure leads to a complex circuit structure. Further, a large loop gain of the phase comparator 102 is needed, and the large loop gain results in poor PLL transfer performance.

A PLL circuit having the structure which compares the phase with only NRZ signal without a reference clock which synchronizes with NRZ signal has been known, which PLL circuit has been developed to solve the problem described herein above. An exemplary circuit of such PLL circuit is shown in FIG. 6. In FIG. 6, an oscillation clock of a voltage control oscillator (VCO) 11 enters to one terminal of a phase comparator (PD) 112 and a frequency comparator (FD) 113 respectively. NRZ signal enters to the other terminal of the phase comparator 112 and frequency comparator 113.

The phase comparator 112 compares the phase of an oscillation clock of the voltage control oscillator 111 and NRZ signal, and generates an UP signal for advancing the phase or a DOWN signal for delaying the phase based on the resultant phase difference. The comparison output of the phase comparator 112 is supplied to the voltage control oscillator 111 through a charge pump circuit 114 and a loop filter 115 as a control voltage for controlling the phase.

On the other hand, the frequency comparator 113 compares an oscillation clock of the voltage control oscillator 111 with a frequency of NRZ signal, and generates an UP signal for increasing the frequency or a DOWN signal for decreasing the frequency based on the resultant frequency difference. The comparison output of the frequency comparator 113 is supplied to the voltage control oscillator 111 through the charge pump circuit 116 and the loop filter 117 as a control voltage for controlling the frequency.

FIG. 7 shows a conventional example of a circuit structure of the frequency comparator 113. NRZ signal, an oscillation clock of the voltage control oscillator 111 shown in FIG. 6, namely VCO clock, CLK, a clock ICLK having the same phase as that of the VCO clock, and a clock QCLK having the phase which delays 90 degrees from that of the clock ICLK are supplied respectively to the conventional circuit.

In FIG. 7, NRZ signal enters to a D-flip-flop (referred to as D-FF hereinafter) 121 as D(data) input and also enters to one terminal of an exclusive-OR (referred to as EX-OR hereinafter) gate 122. D-FF 121 receives a VCO clock as a CK (clock) input. A positive phase output Q of the D-FF 121 enters to the other terminal of the EX-OR gate 122.

The clocks ICLK and QCLK enter to one terminal of respective AND gates 123 and 124. The clock ICLK side input of the AND gate 124 is a negative logic input. The respective outputs of these AND gates 123 and 124 are supplied to D-FF's 125 and 126 as a D-input. The D-FF's 125 and 126 receives an output of the EX-OR gate 122 as a CK input.

Respective positive phase outputs Q of the respective D-FF's 125 and 126 enter to subsequent D-FF 127 and 128 as a D-input, and enter to one terminal of respective AND gates 131 and 132. These D-FF's 127, 128, 129, and 130 receive the VCO clock CLK as the CK input.

Positive phase outputs Q of the D-FF's 129 and 130 enter to the other terminal of the respective AND gates 131 and 132. An output of the AND gate 131 is generated as a DOWN signal for decreasing the frequency and an output of the AND gate 132 is generated as an UP signal for increasing the frequency.

Next, the circuit operation of the frequency comparator having the structure described herein above is described with reference to a timing chart shown in FIG. 8. In the timing chart shown in FIG. 8, an output of the AND gate 124 is denoted by (b), an output of the EX-OR gate 122 is denoted by (c), and the same corresponding components as shown in FIG. 7 are given the same characters shown in FIG. 7.

The output (a) of the AND gate 123 is in "H" level when the clock ICLK and QCLK are both in high level (referred to as "H" level hereinafter), the output (b) of the AND gate 124 is in "H" level when the clock ICLK is in low level (referred to as "L" level hereinafter) and the clock QCLK is in "H" level. The interval while the output (a) of the AND gate 123 is in "H" level is denoted by X, and the interval while the output (b) of the AND gate 124 is in "H" level is denoted by Y.

In a time period of the clock CLK that is the output of the VCO, when a data change of NRZ signal occurs in an interval X as shown in the timing chart in FIG. 8, the data change is detected by the D-FF 121 and the EX-OR gate 122, and the output (c) of the EX-OR gate 122 changes to "H" level.

At that time, because the output (a) of the AND gate 123 is in "H" level, the output (a) is latched by the D-FF 125 at the transition timing of the output (c) of the EX-OR gate 122. The positive phase output Q of the D-FF 125 is thereby changed to "H" level. The positive phase output Q of the D-FF 125 is taken in at the rising timing of the next time period of the VCO clock CLK.

In the next time period of the VCO clock CLK, when the next data change of NRZ signal occurs in an interval Y as shown in the timing chart in FIG. 8, the data change is detected by the D-FF 121 and the EX-OR gate 122, and the output (c) of the EX-OR gate 122 is changed again to "H" level.

At that time, because the output (b) of the AND gate 124 is in "H" level, the output (b) is taken in by the D-FF at the transition timing of the output (c) of the EX-OR gate 122. The positive phase output Q of the D-FF 126 is thereby changed to "H" level. The positive phase output Q of the D-FF 126 is taken in by the D-FF 128 at the rising timing of the next time period of the VCO clock CLK.

The positive phase output Q of the D-FF 127 is also taken in by the D-FF 129. The positive phase outputs Q of the respective D-FF's 128 and 129 are both changed to "H" level, two input of the AND gate 131 are both changed to "H" level, then the output of the AND gate 131 namely UP signal is changed to "H" level.

In other words, when in a time period a data change of NRZ signal occurs in an interval X and in the next time period the next data change of NRZ signal occurs in an interval Y, the time period of VCO clock CLK is shorter than the time period of NRZ signal, that is, the frequency of VCO clock CLK is higher than that of NRZ signal, then a DOWN signal for decreasing the frequency of the VCO clock CLK is generated.

On the other hand, though not shown in the timing chart in FIG. 8, when in a time period a data change of NRZ signal occurs in an interval Y and in the next time period the next data change of NRZ signal occurs in an interval X, because the time period of VCO clock CLK is longer than the time period of NRZ signal, that is, the frequency of the VCO clock CLK is lower than that of NRZ signal, then an UP signal for increasing the frequency of the VCO clock CLK is generated.

However, in such conventional frequency comparator described herein above, because comparison is also performed when the change is not successive as in the case of NRZ data of 10001, the actual phase deviation of only several % is enlarged to the deviation of several ten % due to the space between NRZ data changes, therefore the determination of UP/DOWN could be erroneous. If such erroneous determination continues successively, for example, DOWN signals are generated successively instead of UP signals though UP signals would be generated normally, as the result, the process could be locked just at the double time period of NRZ signal, which locking is sometimes referred to as harmonic lock.

The present invention is accomplished in view of the above-mentioned problem. it is the object of the present invention to provide a frequency comparator which is capable of performing frequency comparison with only NRZ signal without reference clock, and a PLL circuit which will not be involved in the trouble of harmonic lock.

SUMMARY OF THE INVENTION

A frequency comparator according to the present invention is a frequency comparator for comparing the frequency of a predetermined clock signal with the clock frequency of NRZ signal provided with a detecting means for detecting whether there is a data change of the NRZ signal in an interval of one time period of the clock signal, and a comparing means for generating a comparison result only when a data change is detected by the detecting means.

According to the present invention, a PLL circuit is provided with a frequency comparator having the above-mentioned structure as the frequency comparator for comparing the frequency of oscillation clock of a voltage control oscillator with the clock frequency of NRZ signal.

In a frequency comparator having the structure described herein above and a PLL circuit which utilizes the frequency comparator, when frequency comparison is performed by use of only NRZ signal, first the existence of a data change of NRZ signal in an interval of one time period of the predetermined clock signal (oscillation clock of the voltage control oscillator) is detected. A comparison result is generated only when a data change is detected in the interval of one time period of the clock. In other words, only when the data change of NRZ signal occurs successively, frequency comparison is performed and a comparison result is generated.

DETAILED DESCRIPTION OF THE PREFERRED EMBODIMENTS

Embodiments of the present invention will be described in detail hereinafter with reference to the drawings.

Figure 1:
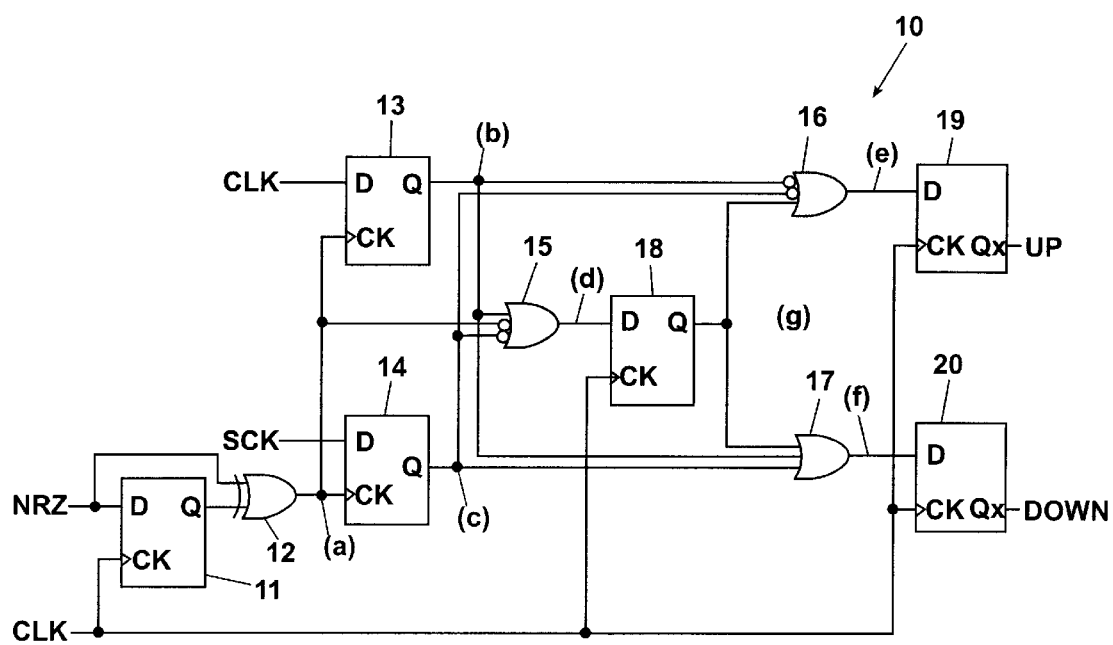
FIG. 1 is a block diagram for illustrating a frequency comparator in accordance with one embodiment of the present invention.

FIG. 1 is a block diagram for illustrating one embodiment of the present invention. NRZ signal and clock CLK having the same frequency as the clock frequency of the NRZ signal, and (auxiliary clock) SCK having the phase delayed 90 degrees from that of the clock CLK enter to a frequency comparator 10 in accordance with the present embodiment.

In FIG. 1, an NRZ signal enters to a D-FF 11 as a D input and also enters to one terminal of an EX-OR gate 12 as one input. The D-FF 11 receives a clock CLK as a CK input. A positive phase output Q of the D-FF 11 enters to the EX-OR gate 12 as the other input.

When the NRZ data changes, the change timing data is delayed one clock by the D-FF 11, and is supplied to the EX-OR gate 12 together with the next clock timing data, then the output level of the EX-OR gate 12 is changed from "L" level to "H" level. The output level of the EX-OR gate 12 returns to "L" level at the rising of the clock CLK. In other words, the D-FF 11 and the EX-OR gate 12 function as a mean for detecting the data change of NRZ signal.

The output of the EX-OR gate 12 enters D-FF's 13 and 14 respectively as CK input, and also enters the OR gate 15 as one of the three inputs. The D-FF 13 receives the clock CLK as a D input, and takes in the logic of the clock CLK correspondingly to the output of the EX-OR gate 12 which is given as a CK input when the NRZ data changes. A positive phase output Q of the D-FF 13 is supplied to the OR gate 15 as another input, and also supplied to OR gates 16 and 17 as one of the three inputs.

The D-FF 14 receives the clock SCK as a D input, and takes in the logic of the clock SCK correspondingly to the output of the EX-OR gate 12 which is given as a CK input when the NRZ data changes. A positive phase output Q of the D-FF 14 is supplied to OR gate 15 as the residual one input and also supplied to the OR gates 16 and 17 as another input. These D-FF' 13 and 14 function as a means for detecting the change position of the NRZ data in one time period of the clock CLK.

Two inputs among the three inputs of the OR gate 15, namely in the present embodiment are an input supplied from the EX-OR gate 12 and an input of the positive phase output Q supplied from the D-FF 14 are negative logic inputs. An output from the OR gate 15 is supplied to a D-FF 18 as a D input. The D-FF 18 receives the clock CLK as a CK input, and takes in the logic of the output of the OR gate 15 at the rising timing. The OR gate 15 and the D-FF 18 constitute a means for setting a reference point for detecting the time period of the NRZ signal.

A positive phase output Q of the D-FF 18 is supplied to the OR gates 16 and 17 as the residual one input. Two inputs among the three inputs of the OR gate 16, namely in the present embodiment are the input of the positive phase output Q from the D-FF 13 and the input of the positive phase output Q of the D-FF 14 are negative logic inputs. Outputs of the OR gates 16 and 17 enter respectively to D-FF's 19 and 20 as a D input. The D-FF's 19 and 20 receive the clock CLK as a CK input, and take in the logic of the outputs of the respective OR gates 16 and 17 at the rising timing.

An opposite phase output Qx of the D-FF 19 is generated as a signal for increasing the frequency and an opposite phase output Qx of the D-FF 20 is generated as a signal for decreasing the frequency. In detail, the OR gate 16 and the D-FF 19 constitute a means which detects the phase of NRZ signal in the time period subsequent to the clock CLK and generates an UP signal if some deviation is detected, and the OR gate 17 and the D-FF 20 constitute a means which detects the phase of NRZ signal in the clock subsequent to the clock CLK and generates a DOWN signal if some deviation is detected.

Next, the circuit operation of the frequency comparator in accordance with the present embodiment having the structure described herein above is described with reference to FIG. 2 and FIG. 3.

Figure 2:
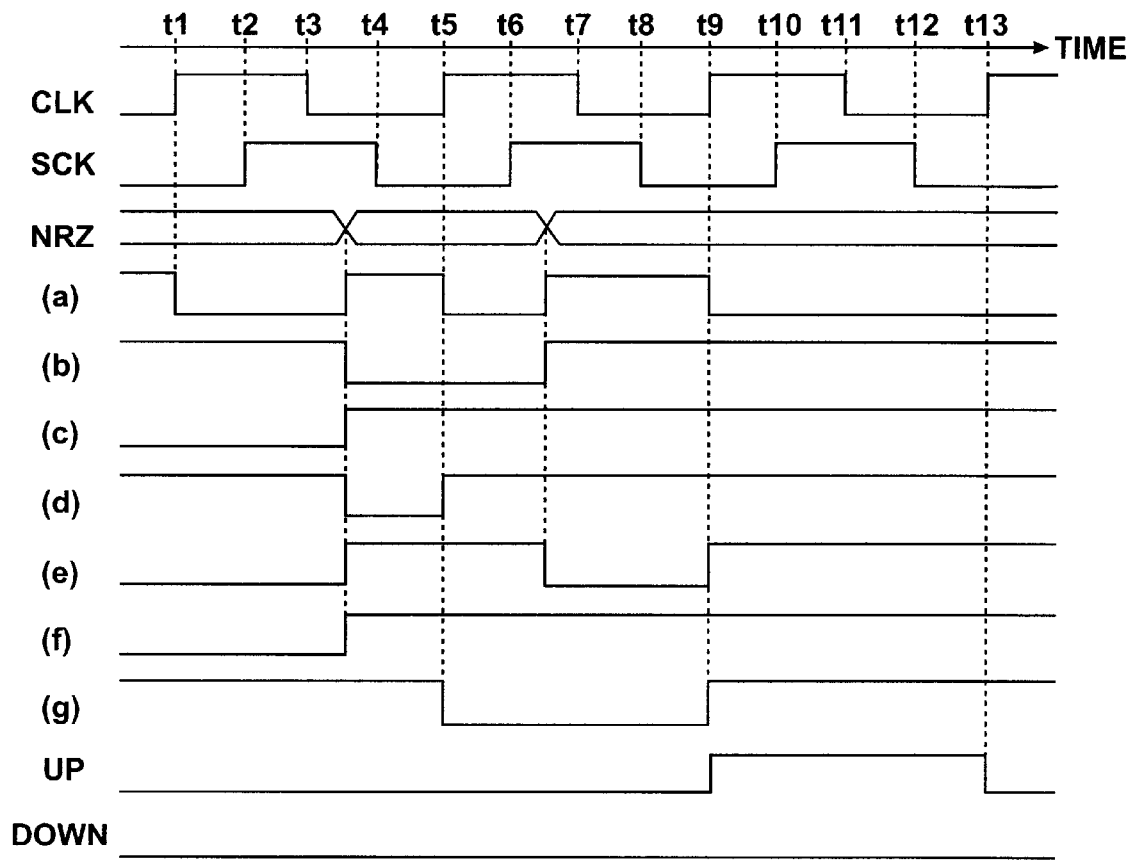
FIG. 2 is a timing chart (No. 1) for describing the circuit operation of the frequency comparator in accordance with the present embodiment.
Figure 3:
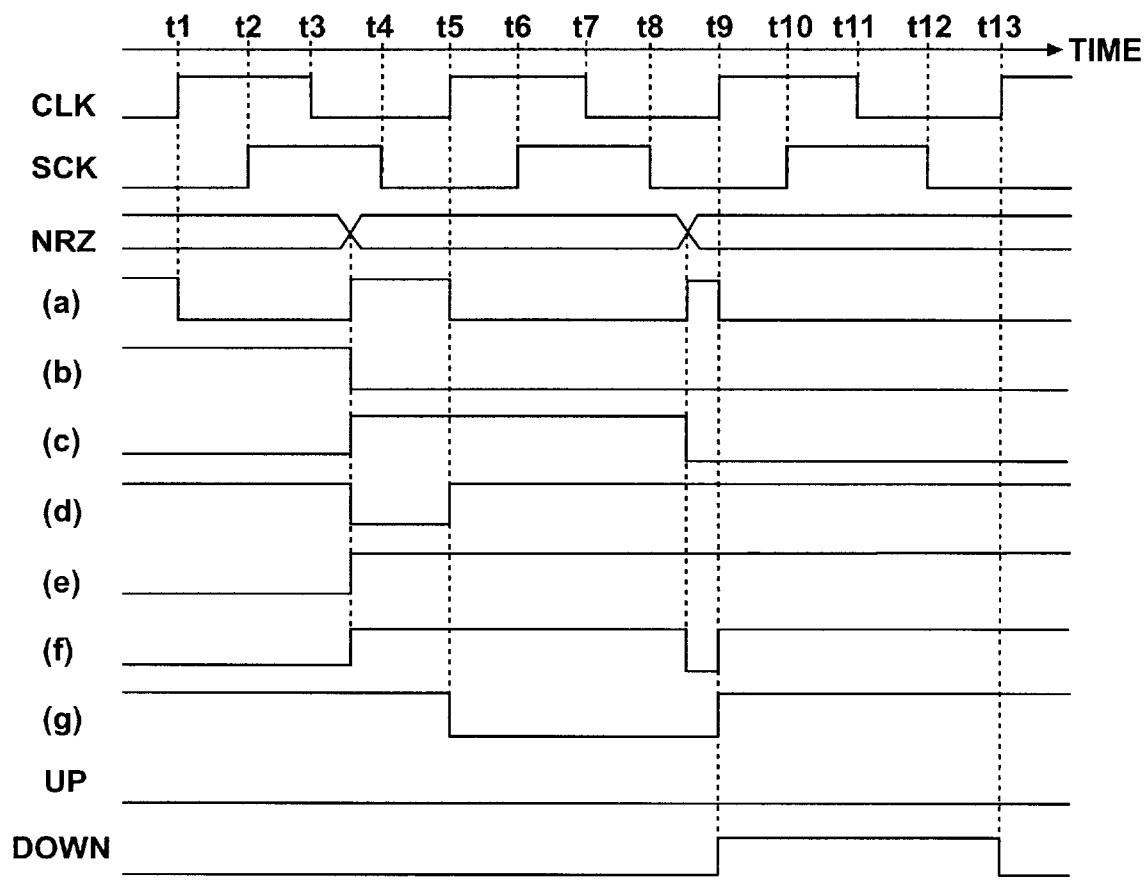
FIG. 3 is a timing chart (No. 2) for describing the circuit operation of the frequency comparator in accordance with the present embodiment.

In timing charts shown in FIG. 2 and FIG. 3, (a) denotes the output of the EX-OR gate 11, (b) denotes the positive phase output Q of the D-FF 13, (c) denotes the positive phase output of the D-FF 14, (d) denotes the output of the OR gate 15, (e) denotes the output of the OR gate 16, (f) denotes the output of the OR gate 17, and (g) denotes the positive phase output Q of the D-FF 18, and components corresponding to those shown in FIG. 1 are given the same characters shown in FIG. 1.

First, it is assumed that NRZ data changes in the interval between the time t3 and time t4 in the timing charts shown in FIG. 2 and FIG. 3, then the output (a) of the EX-OR gate 12 changes from "L" level to "H" level. When, the clock CLK is in "L" level logic and the clock SCK is in "H" level logic, and these logic are taken into the D-FF'13 and 14. The positive phase output Q(b) of the D-FF13 changes to "L" level and the positive phase output (c) of the D-FF 14 changes to "H" level, and then the output (d) of the OR gate 15 changes to "L" level and outputs (e) and (f) of the respective OR gates 16 and 17 change both to "H" level.

When the clock CLK rises at the time t5, synchronously the output (a) of the EX-OR gate 12 returns to "L" level and the output (d) of the OR gate 15 returns to "H"level, and the D-FF 18 takes in "H" level logic of the output (d) of the OR gate 15, and the positive phase output Q(g) is thereby changed to "L" level. This time point is set as the reference point for detecting the time period of NRZ signal. When, the D-FF's 19 and 20 take in "H" logic of the respective outputs (e) and (f) of the OR gates 16 and 17 simultaneously, and the UP signal and DOWN signal which are opposite phase outputs are in "L" level.

As shown in the timing chart in FIG. 2, when the next data change of NRZ signal occurs in the interval between the time t6 and t7, the output (a) of the EX-OR gate 12 changes from "L" level to "H" level again. When, the clocks CLK and SCK are in "H" level logic, and the logic is taken into the D-FF's 13 and 14. The positive phase output Q(b) of the D-FF 13 is thereby changed to "H" level, while the positive phase output Q(c) remains in "H" level continuously.

Simultaneously, the output (e) of the OR gate 16 changes to "L" level, while the output (f) of the OR gate 17 remains in "H" level continuously. When the clock CLK rises at the time t9, the output (a) of the EX-OR gate 12 returns to "L" level synchronously, and the D-FF 18 takes in "H" level logic of the OR gate 15 and the positive phase output Q(g) is thereby changed to "H" level.

Simultaneously, the D-FF 19 takes in "L" level logic of the output (e) of the OR gate 16 and the D-FF 20 takes in "H" level logic of the output (f) of the OR gate 17, then only the UP signal which is the opposite phase output Qx of the D-FF 19 changes to "H" level. When, the positive phase output Q(g) of the D-FF 18 changes to "H" level, simultaneously the output (e) of the OR gate 16 also changes to "H" level.

When the clock CLK rises at the time t13, the D-FF 19 takes in "H" level logic of the output (e) of the OR gate 16, then the UP signal is thereby changed to "L" level. In other words, as the result of comparison between the clock frequency of NRZ signal and the frequency of the clock CLK, it reveals that the frequency of the clock CLK is lower than that of NRZ, then an UP signal for increasing the frequency of the clock CLK is generated during one time period of the clock CLK.

When the next data change of NRZ signal occurs in an interval between the time t7 and time t8, in this interval the clock CLK is in "L" level and the clock SCK is in "H" level, because the situation is the same as that of the first NRZ data change, namely the interval between the time t3 and t4, the logic does not change. Therefore in this case, the data change of NRZ signal occurs in the interval between time t9 and time t13, which is the next one time period of the clock CLK.

Next, as shown in the timing chart in FIG. 3, when the next data change of NRZ signal occurs in the interval in between the time t8 and time t9, the output (a) of the EX-OR gate 12 changes again from "L" level to "H" level as in the previous case. Because the clocks CLK and SCK are both in "L"logic at that time, the positive phase output (b) of the D-FF 13 which takes in the logic remains in "L" level and the positive phase output (c) of the D-FF 14 changes from "H" level to "L" level.

Thus, all the three inputs of the OR gate 17 are "L"level, then the output (f) also changes to "L" level. When the clock CLK rises at the time t9, the output (a) of the EX-OR gate 12 returns to "L" level synchronously, and the D-FF 18 takes in "H" level logic of the OR gate 15 and then the positive phase output Q(g) changes to "H" level.

Simultaneously, the D-FF 19 takes in "H" level logic of the output (e) of the OR gate 16 and the D-FF 20 takes in "L" level logic of the output (f) of the OR gate 17, then only the DOWN signal which is the opposite phase output Qx of the D-FF 20 changes to "H" level. When, the positive phase output Q(g) of the D-FF 18 changes to "H" level and the output (f) of the OR gate 17 changes synchronously to "H" level.

When the clock CLK rises at the time t13, the D-FF 20 takes in "H" level logic of the output (f) of the OR gate 17, and then the DOWN signal changes to "L" level. In other words, as the result of comparison between the clock frequency of NRZ signal and the frequency of the clock CLK, it reveals that the frequency of the clock CLK is higher (time period is shorter) than that of NRZ, then a DOWN signal for decreasing the frequency of the clock CLK is generated during one time period of the clock CLK.

When a data change of NRZ signal occurs in the interval between the time t5 and time t6, the clock CLK is in "H" level logic and the clock SCK is in "L" level logic in this interval, the output (b) of the D-FF 13 changes to "H" level and the output (c) of the D-FF 14 changes to "L" level, and outputs (e) and (f) of the respective OR gates 16 and 17 change both to "H" level, therefore the UP signal and DOWN signal remain both in "L" level.

If no data change occurs in the interval between the time t5 and time t9, the situation at the time when the clock data changed first time, namely the situation where the output (b) of the D-FF 13 is in "L" level and the output (c) of the D-FF is in "H" level, is maintained as it is, and outputs (e) and (f) of the respective OR gates 16 and 17 change both to "H" level, then the UP signal and the DOWN signal remain both in "L" level.

Further when a data change occurs before the clock CLK rises at the time t5, because the positive phase output Q(g) of the D-FF 18 is in "H" level and the outputs (e) and (f) of the respective gates 16 and 17 changes both to "H" level, the UP signal and DOWN signal remain both in "L" level.

According to the frequency comparator 10 in accordance with the present embodiment, frequency comparison is performed by use of only NRZ signal without using reference clock, therefore determination of UP/DOWN will not be erroneous because frequency comparison is performed only for successive data change of NRZ signal.

Figure 4:
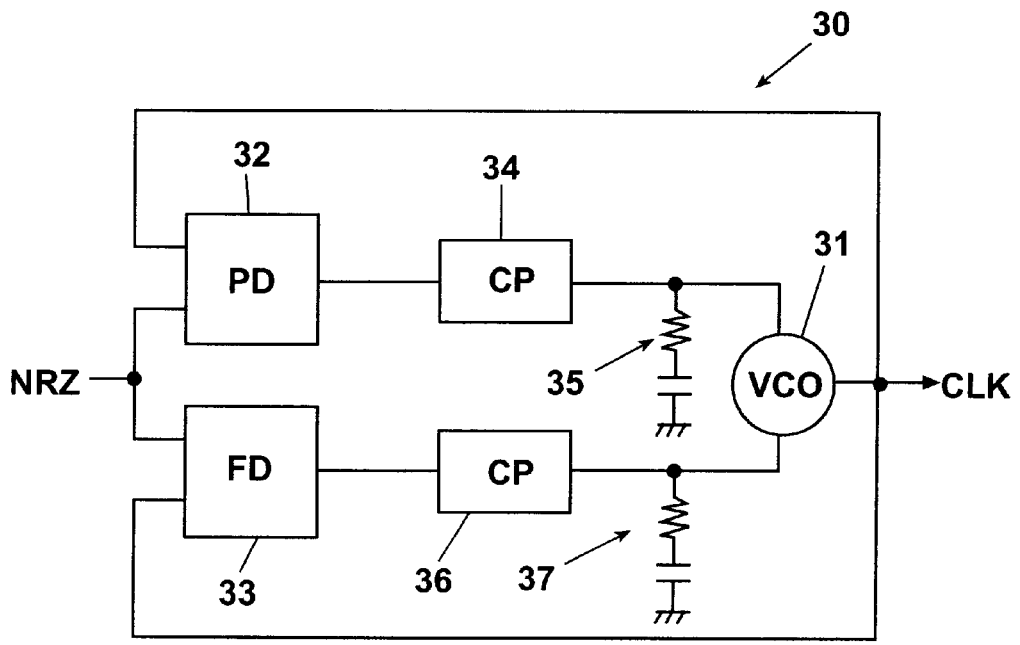
FIG. 4 is a block diagram for illustrating an exemplary structure of a PLL circuit in accordance with the present invention.
Figure 5:
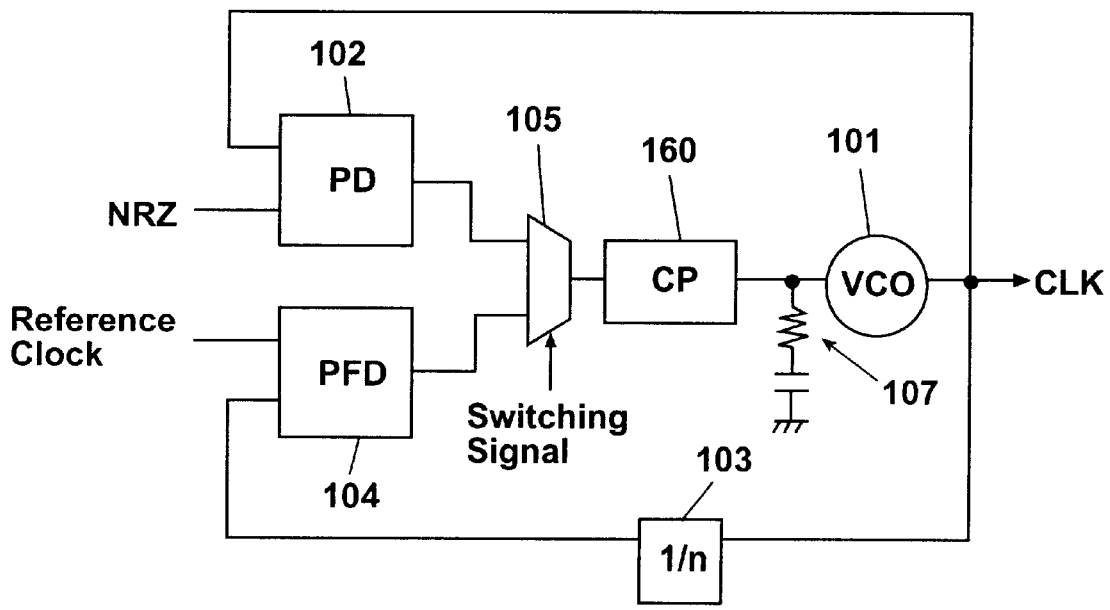
FIG. 5 is a block diagram for illustrating a conventional example of a PLL circuit.
Figure 6:
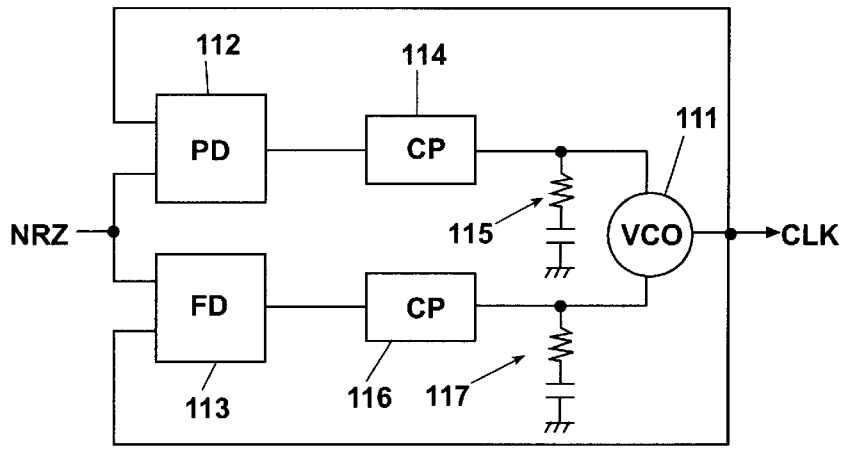
FIG. 6 is a block diagram for illustrating another conventional example of a PLL circuit.
Figure 7:
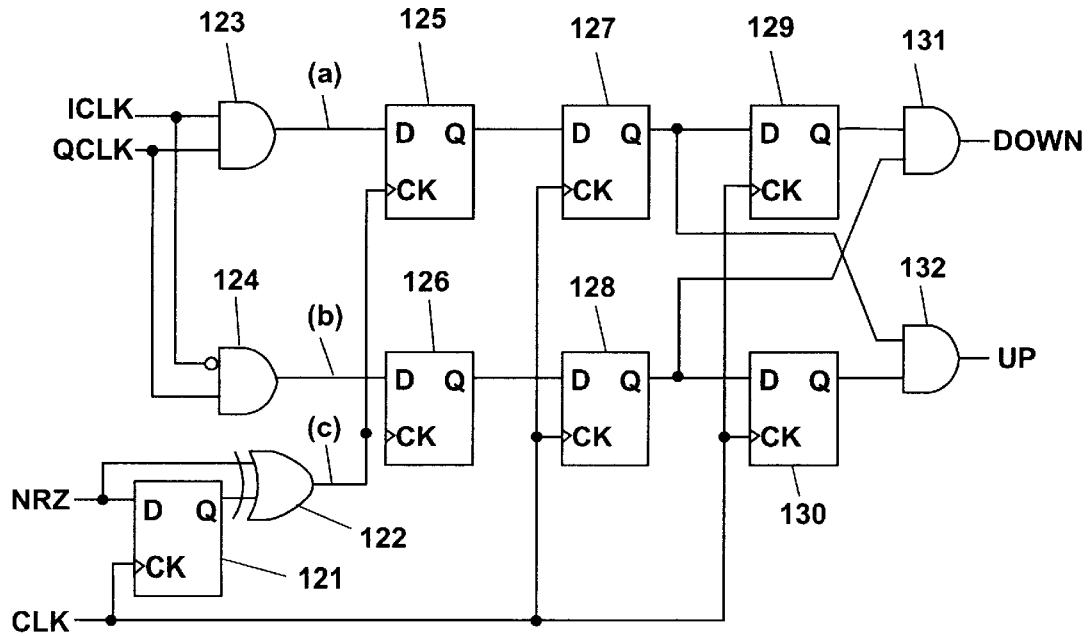
FIG. 7 is a block diagram for illustrating the structure of a conventional exemplary frequency comparator.
Figure 8:
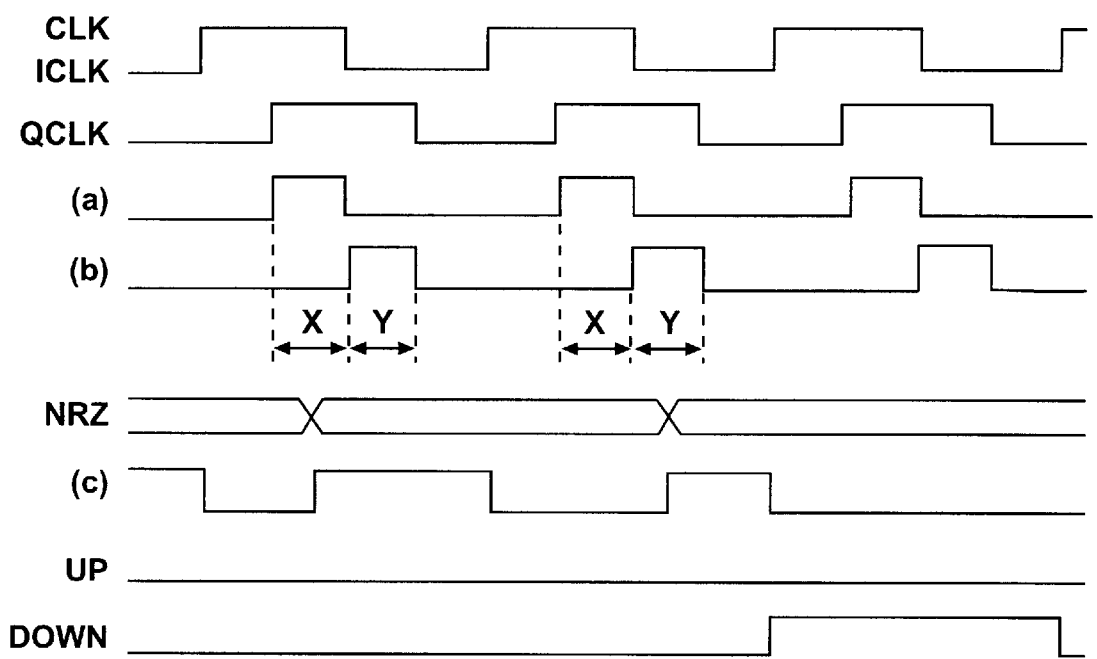
FIG. 8 is a timing chart for describing the circuit operation of the frequency comparator in accordance with the conventional example.

FIG. 4 is a block diagram for illustrating an exemplary structure of a PLL circuit in accordance with the present invention. As shown in FIG. 4, the PLL circuit 30 in accordance with the present invention is provided with a voltage control oscillator (VCO) 31, a phase comparator (PD) 32, a frequency comparator (FD) 33, charge pump circuits 34 and 35, and loop filters 35 and 36, wherein the frequency comparator 10 having the structure shown in FIG. 1 is used as the frequency comparator 33.

In the PLL circuit 30 having the structure described herein above, the oscillation clock (VCO clock) of the voltage control oscillator 31 is supplied to the phase comparator 32 and the frequency comparator 33 as one input. NRZ signal is supplied to the phase comparator 32 and the frequency comparator 33 as the other input.

The phase comparator 32 compares the phase of the VCO clock with the phase of the NRZ signal, and generates an UP signal for advancing the phase or a DOWN signal for delaying the phase based on the resultant phase difference. The comparison output of the phase comparator 32 is supplied to the voltage control oscillator 31 through the charge pump circuit 34 and the loop filter 35 as a control voltage for controlling the phase of the VCO clock.

On the other hand, the frequency comparator 33 compares the frequency of the VCO clock and the frequency of NRZ signal, and generates an UP signal for increasing the frequency or a DOWN signal for decreasing the frequency based on the resultant frequency difference. The comparison output of the frequency comparator 33 is supplied to the voltage control oscillator 31 through the charge pump circuit 36 and the CR loop filter 37 as a control voltage for controlling the frequency of the VCO clock.

In the structure which constitutes the PLL circuit 30 by use of the frequency comparator 10 in accordance with the present embodiment shown in FIG. 1, the frequency comparator 10 performs frequency comparison only on successive data change of the NRZ signal and does not therefore generate erroneous UP signal/DOWN signal, thus a PLL circuit which will not be involved in the trouble of harmonic lock, which trouble occurs at the doubled time period of NRZ signal, is provided.

The circuit structure shown in the above-mentioned embodiment is only an example, and the present invention is by no means limited to this circuit structure.

As described herein above, according to the present invention, when the frequency is compared by use of only NRZ signal, the existence of data change of NRZ signal in an interval of one time period of the clock signal is detected, and a comparison result is generated only when a data change is detected in the interval of one time period of the clock signal, then an erroneous UP signal/DOWN signal will not be generated. Thus a PLL circuit which prevents the trouble of harmonic lock, that occurs at the doubled time period of NRZ signal is provided.

What is claimed is:

1. A frequency comparator for comparing the frequency of a predetermined clock signal with the clock frequency of NRZ signal comprising:

detecting means for detecting whether there is a data change of said NRZ signal in an interval of one time period of said clock signal; and comparing means for generating a comparison result only when a data change is detected by said detecting means;

wherein said detecting means is provided with data change detecting means for detecting a data change of said NRZ signal, and change position detecting means for detecting a data change position of said NRZ signal in a time period of said clock signal by taking in the logic of said clock signal and an auxiliary clock signal having the phase which delays 90 degrees from that of said clock signal in response to the detection output of said data detecting means.

2. A frequency comparator for comparing the frequency of a predetermined clock signal with the clock frequency of NRZ signal comprising:

detecting means for detecting whether there is a data change of said NRZ signal in an interval of one time period of said clock signal; and comparing means for generating a comparison result only when a data change is detected by said detecting means;

wherein said comparing means is provided with setting means for setting a reference point for detecting the time period of said NRZ signal and phase detecting means for detecting the phase of said NRZ signal in one time period subsequent to said clock signal to generate said comparison result based on said reference point set by said setting means.

3. A PLL circuit having a voltage control oscillator and a frequency comparator for comparing the frequency of an oscillation clock of said voltage control oscillator with the clock frequency of NRZ signal for controlling the frequency of oscillation clock of said voltage oscillator based on a comparison output of said frequency comparator, wherein said frequency comparator comprising:

detecting means for detecting whether there is a data change of said NRZ signal in an interval of one time period of said clock signal; and comparing means for generating a comparison result only when a data change is detected by said detecting means;

wherein said detecting means is provided with data change detecting means for detecting a data change of said NRZ signal, and change position detecting means for detecting a data change position of said NRZ signal in a time period of said clock signal by taking in the logic of said clock signal and an auxiliary clock signal having the phase which delays 90 degrees from that of said clock signal in response to the detection output of said data detecting means.

4. A PLL circuit having a voltage control oscillator and a frequency comparator for comparing the frequency of an oscillation clock of said voltage control oscillator with the clock frequency of NRZ signal for controlling the frequency of oscillation clock of said voltage oscillator based on a comparison output of said frequency comparator, wherein said frequency comparator comprising:

detecting means for detecting whether there is a data change of said NRZ signal in an interval of one time period of said clock signal; and comparing means for generating a comparison result only when a data change is detected by said detecting means;

wherein said comparing means is provided with setting means for setting a reference point for detecting the time period of said NRZ signal and phase detecting means for detecting the phase of said NRZ signal in one time period subsequent to said clock signal to generate said comparison result based on said reference point set by said setting means.

5. A PLL circuit as claimed in claim 3, wherein said PLL circuit is provided additionally with a phase comparator for comparing the phase of said voltage control oscillator with the phase of NRZ signal, and a charge pump circuit to which outputs of said phase comparator and said frequency comparator are supplied, and an output of said charge pump is supplied to said voltage control oscillator.

6. A PLL circuit as claimed in claim 4, wherein said PLL circuit is provided additionally with a phase comparator for comparing the phase of said voltage control oscillator with the phase of NRZ signal, and a charge pump circuit to which outputs of said phase comparator and said frequency comparator are supplied, and an output of said charge pump is supplied to said voltage control oscillator.

* * * * *